US007629690B2

(12) United States Patent
Wu et al.

(10) Patent No.: US 7,629,690 B2
(45) Date of Patent: Dec. 8, 2009

(54) DUAL DAMASCENE PROCESS WITHOUT AN ETCH STOP LAYER

(75) Inventors: Tsang-Jiuh Wu, Hsin-Chu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 721 days.

(21) Appl. No.: 11/294,140

(22) Filed: Dec. 5, 2005

(65) Prior Publication Data
US 2007/0200241 A1    Aug. 30, 2007

(51) Int. Cl.
*H01L 29/40* (2006.01)
*H01L 23/52* (2006.01)
(52) U.S. Cl. .............................. 257/758; 257/E21.575; 257/E21.597
(58) Field of Classification Search ................ 438/253; 257/758, E21.575–21.597, E21.627, E21.641 E
See application file for complete search history.

(56) References Cited
U.S. PATENT DOCUMENTS

| 6,417,094 | B1 * | 7/2002 | Zhao et al. | 438/627 |
| 6,472,306 | B1 * | 10/2002 | Lee et al. | 438/623 |
| 2004/0251549 | A1 * | 12/2004 | Huang et al. | 257/758 |
| 2006/0234443 | A1 * | 10/2006 | Yang et al. | 438/253 |

* cited by examiner

*Primary Examiner*—Kimberly D Nguyen
*Assistant Examiner*—Tony Tran
(74) *Attorney, Agent, or Firm*—Slater & Matsil, L.L.P.

(57) ABSTRACT

A non-ESL semiconductor interconnection structure and a method of forming the same are provided. The non-ESL semiconductor interconnection structure includes a first low-k dielectric layer comprising a first region and a second region overlying the substrate, a plurality of conductive features in the first low-k dielectric layer, a cap layer on at least a portion of the conductive features, and a dielectric capping layer overlying the first low-k dielectric layer in the second region but not in the first region. The conductive features in the second region have a substantially greater spacing than the conductive features in the first region. The dielectric capping layer preferably has an inherent compressive stress.

23 Claims, 7 Drawing Sheets

DUAL DAMASCENE PROCESS WITHOUT AN ETCH STOP LAYER

TECHNICAL FIELD

This invention relates generally to fabrication processes of the interconnection structure of an integrated circuit, and more particularly to damascene processes.

BACKGROUND

Conventional integrated circuits contain a plurality of patterns of metal lines separated by inter-wiring spacings, and a plurality of interconnect lines, such as bus lines, bit lines, word lines and logic interconnect lines. Typically, the metal patterns of vertically spaced metal lines are electrically interconnected by vias. Metal lines formed in trench-like openings typically extend substantially parallel to the semiconductor substrate. Semiconductor devices of such type according to current technology may comprise eight or more levels of metallization to satisfy device geometry and micro-miniaturization requirements.

A common method for forming metal lines or vias is known as "damascene". Generally, this process involves forming an opening in the dielectric interlayer that separates the vertically spaced metallization layers. The opening is typically formed using conventional lithographic and etching techniques. After an opening is formed, the opening is filled with copper or copper alloys to form a via. Excess metal material on the surface of the dielectric interlayer is then typically removed by chemical mechanical planarization (CMP).

Copper has replaced aluminum because of its lower resistivity and higher reliability. However, copper still suffers from electro migration (EM) and stress migration (SM) reliability issues as geometries continue to shrink and current densities increase.

In conventional interconnection structures, metal lines, which are typically formed of copper or copper alloys, are interconnected by vias. Etch stop layers (ESLs) are formed for better etch control. Diffusion barrier layers are typically formed to prevent copper from diffusing into neighboring low-k dielectric layers. The ESLs play an important role in the structure. Besides acting as etch stops, the ESLs also act as diffusion barrier layers preventing copper from diffusing into the respective overlying low-k dielectric layers, which are typically porous and vulnerable to copper "poisoning".

The above-discussed structure, however, suffers performance problems when used in very small-scale integrated circuits. The ESLs are typically formed of a dielectric material having a higher k value than that of the low-k dielectric layers. As is well known in the art, the capacitance of a capacitor is proportional to the dielectric constant (k value) of the dielectric material between the capacitor plates. With ESLs having a higher k value, the effective k value of the material between the capacitor plates (metal lines) increases. Additionally, capacitance between closely located metal lines in the same metallization layer also increases. Consequently, RC delay of the integrated circuit increases.

A non-ESL method has been developed to solve this problem by forming metal cap layers instead of ESLs on the copper lines. The cap layers are typically formed of materials that suffer less from diffusion, and that can prevent copper from diffusing into the overlying low-k dielectric layers. Without the ESLs, the parasitic capacitance is reduced.

The non-ESL approach, however, has introduced another problem. A low-k dielectric layer typically has an inherent tensile stress. Stacked tensile layers tend to crack when the thickness is beyond a threshold called the cracking threshold. ESL layers typically have inherent compressive stress and can provide a structure support to the semiconductor structure, preventing overlying and underlying low-k dielectric layers from cracking. The lack of ESLs, therefore, may result in a weaker semiconductor structure.

In order to maintain the integrity of the semiconductor structures without sacrificing performance of the integrated circuits, a new method of forming interconnection structures is needed.

SUMMARY OF THE INVENTION

The preferred embodiment of the present invention provides a non-ESL semiconductor interconnection structure and a method of forming the same.

In accordance with one aspect of the present invention, the non-ESL semiconductor interconnection structure includes a first low-k dielectric layer comprising a first region and a second region overlying a substrate, a plurality of conductive features (such as metal lines) in the first low-k dielectric layer, a cap layer on at least a portion of the conductive features, and a dielectric capping layer overlying the first low-k dielectric layer in the second region but not in the first region. The conductive features in the second region have a substantially greater spacing than the conductive features in the first region. The dielectric capping layer preferably has an inherent compressive stress.

In accordance with another aspect of the present invention, recesses are formed in the first region of the first low-k dielectric layer. The recesses may have a depth of greater than about 10 Å, and more preferably between about 10 Å and about 200 Å.

In accordance with another aspect of the present invention, the semiconductor structure further includes a third low-k dielectric layer over the second low-k dielectric layer. Conductive features in the third low-k dielectric layer preferably have greater spacings than the conductive features in the first and second low-k dielectric layers. It is optional to form a dielectric capping layer between the second and the third low-k dielectric layers. The dielectric capping layers may be formed over every other high-level low-k dielectric layers.

In accordance with yet another aspect of the present invention, a method of forming the preferred embodiments of the present invention includes providing a substrate, forming a first low-k dielectric layer overlying the substrate, forming a plurality of openings in the first low-k dielectric layer in a first region and a second region, filling the openings with a conductive material to form a plurality of conductive features, selectively forming a cap layer overlying the conductive features, and forming a dielectric capping layer over the first low-k dielectric layer in the second region but not the first region. The conductive features in the second region have a greater spacing than the conductive features in the first region.

The preferred embodiments of the present invention not only improve the strength of the semiconductor structure, but also reduce the parasitic capacitance between conductive features.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
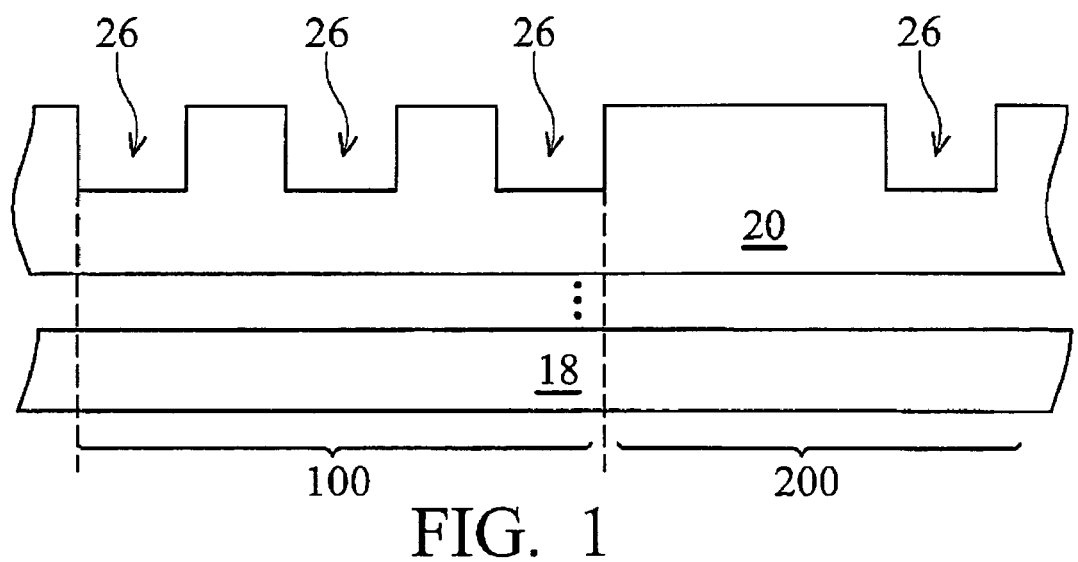
FIGS. 1 through 9B are cross-sectional views of intermediate stages in the manufacture of a preferred embodiment.

FIGS. 1 through 9B are cross-sectional views of intermediate stages in the making of a preferred embodiment of the present invention. FIG. 1 illustrates the formation of a low-k dielectric layer 20 over a substrate 18. The substrate 18 includes regions 100 and 200. In the preferred embodiment, the low-k dielectric layer 20 is an inter-metal dielectric (IMD) layer preferably having a dielectric constant (k value) lower than about 2.5 (hence called an extremely low-k dielectric layer). Preferably, the low-k dielectric layer 20 comprises nitrogen, carbon, hydrogen, oxygen, fluorine, and combinations thereof. Openings 26 are formed in the low-k dielectric layer 20, preferably by anisotropic etching.

Figure 2A:
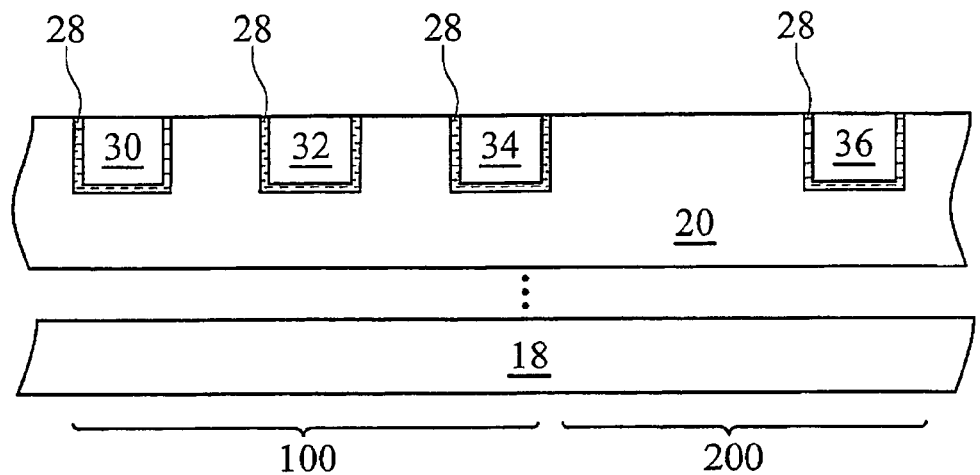

FIG. 2A illustrates a diffusion barrier layer 28 and conductive lines (features) 30, 32, 34 and 36 formed in the trenches 26. The diffusion barrier layer 28 is formed on the sidewalls and the bottom of the openings 26, preferably using metal or metal alloys, such as titanium, titanium nitride, tantalum, tantalum nitride, or other alternatives. A conductive material is then filled in the remaining openings 26. A chemical mechanical planarization (CMP) is performed to level the surface, leaving conductive lines 30, 32, 34 and 36. In the preferred embodiment, the conductive lines 30, 32, 34 and 36 preferably comprise copper or copper alloys, although other metals such as aluminum, silver, gold, and alloys thereof can also be used.

Figure 2B:
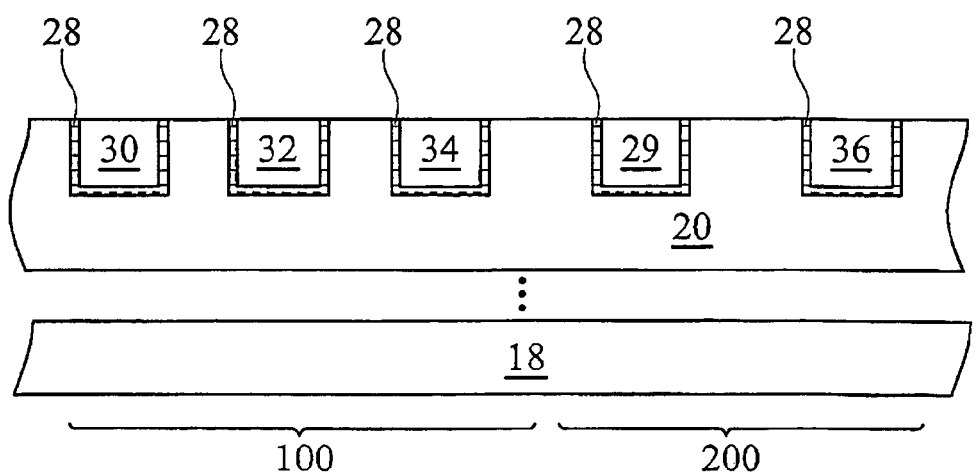

FIG. 2B illustrates a variation of the embodiment shown in FIG. 2A. As region 100 is a feature-dense region and region 200 is a feature-sparse region, pattern-loading effects occur. In order to reduce dishing effects caused by CMP, a dummy feature 29 is formed. The dummy feature 29 increases the feature density in region 200 and reduces pattern-loading effects. The dummy feature 29 is not connected to active devices in subsequent fabrication processes.

Figure 3:
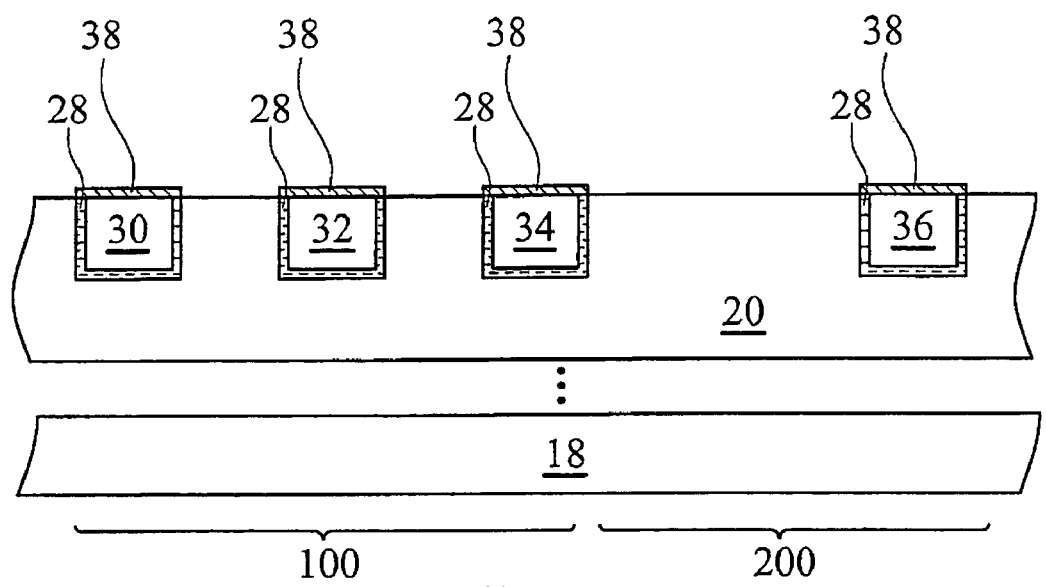

FIG. 3 illustrates caps 38 selectively formed on conductive lines 30, 32, 34 and 36. The caps 38 are preferably formed of metals or metal alloys, thus are also referred to as metal caps throughout the description. Caps 38 can also be formed of other materials such as dielectrics through which vias are formed. Metal caps 38 have a preferred thickness of about 2 nm to 20 nm, and more preferably about 10 nm. The metal caps 38 prevent copper from diffusing into the subsequently formed overlying dielectric layer. The metal caps 38 preferably comprise metals or metal alloys such as cobalt, nickel, tungsten, molybdenum, tantalum, and the like. Metal nitrides such as TaN, TiN, TaSiN, TiSiN, and TaN combined with cobalt can also be used. In the preferred embodiment, the metal caps 38 are formed using electroless plating, which selectively forms the metal caps 38 on conductive materials only. In other embodiments, a cap layer is deposited using common techniques such as sputtering, plasma enhanced CVD, atomic layer deposition, and the like. The cap layer is then etched to form the caps 38.

Figure 4:
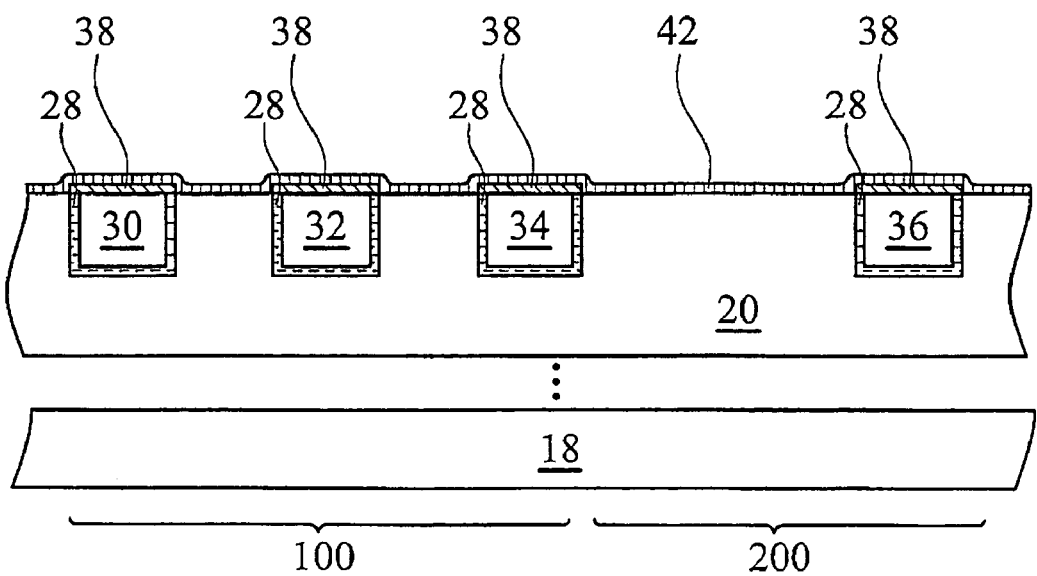

FIG. 4 shows a dielectric capping layer 42 blanket deposited on the metal caps 38 and low-k dielectric layer 20. The dielectric capping layer 42 preferably has a compressive stress, and thus is also referred to as compressive layer 42 throughout the description. The compressive stress is preferably greater than about 0.5 GPa. The compressive layer 42 preferably has a dielectric constant of less than about 4, and preferably comprises combinations of carbon, silicon, nitrogen, and oxygen, such as silicon oxycarbide, silicon nitride, silicon oxynitride, and the like. The preferred method of formation includes commonly used methods such as chemical vapor deposition (CVD), physical vapor deposition (PVD), spin-on (for spin-on glass), atomic layer deposition (ALD), and the like. The thickness of the compressive layer is preferably between about 50 Å and about 1000 Å, and more preferably between about 100 Å and about 500 Å.

Figure 5:
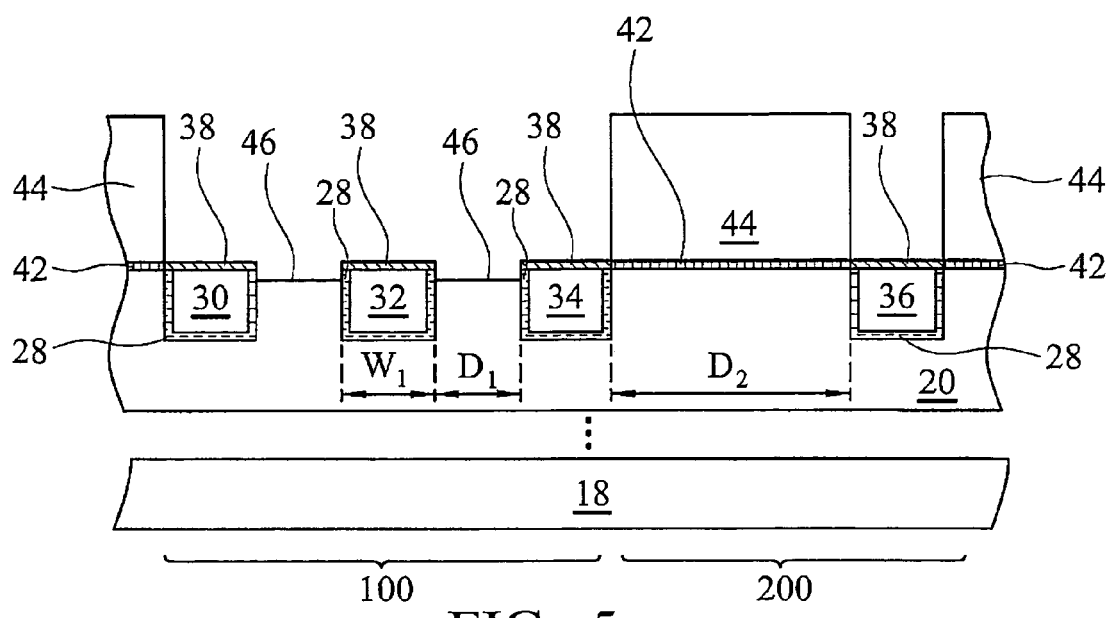

The compressive layer 42 is a dielectric typically having a higher dielectric constant than the low-k dielectric layer 20 and the subsequently formed IMD layer. Therefore, it adversely affects the parasitic capacitance. Portions of the compressive layer 42 causing the most effects to the parasitic capacitance are preferably removed. FIG. 5 illustrates the removal of the compressive layer 42 from region 100 and from areas over the caps 38 in region 200. In order to remove the compressive layer 42, a photo resist 44 is formed and patterned. The exposed portions of compressive layer 42 are then removed, preferably by etching. Since the low-k dielectric layer 20 has a low k value, it is structurally weak, causing recesses 46 formed in the low-k dielectric layer 20. In the preferred embodiment, the recess has a depth of greater than about 10 Å, and preferably, the recess is controlled at between about 10 Å and about 200 Å.

Whether the compressive layer 42 should be removed from a certain region or not is preferably determined by the spacing of the conductive lines in the region. For example, in region 100, conductive lines 30, 32 and 34 are closely located, and the parasitic capacitances between these conductive lines are more significant. The compressive layer 42 thus needs to be removed from region 100. Generally, if the spacing $D_1$ between conductive lines in a region is less than a maximum spacing, the compressive layer 42 is preferably removed from the region. The maximum spacing is preferably less than about 200 percent of the line width $W_1$ of the respective conductive lines. Preferably, the maximum spacing is less than about 2000 Å.

In region 200, the spacing between the conductive lines 34 and 36 is greater, hence the parasitic capacitance between those lines is smaller. Preferably, if the spacing $D_2$ between two conductive lines is greater than a minimum spacing, which is about 300 percent of the line width $W_1$ of the respective conductive lines, the compressive layer 42 therebetween is not removed. Preferably, the minimum spacing is greater than about 3000 Å.

One skilled in the art will realize that the criteria used for determining whether the compressive layer should be removed from a region or not is a design decision, and can be affected by various other factors, such as the k value and the mechanical property of the low-k dielectric layer 20. Typically, the lower the k value of the dielectric layer 20, the greater effect a compressive layer 42 has on the parasitic capacitance, and the more compressive layer is removed. The factors also include the mechanical properties of the low-k dielectric layer 20, wherein weaker low-k dielectric layers 20 and IMD layers demand more of the compressive layer 42 to be saved. One skilled in the art will be able find an optimum balancing point between removing and saving the compressive layer. If the spacing between metal features in a device region falls between the maximum spacing and the minimum spacing, the above discussed factors will be taken into account to determine whether the compressive layer should be removed from the device region or not.

Figure 6:
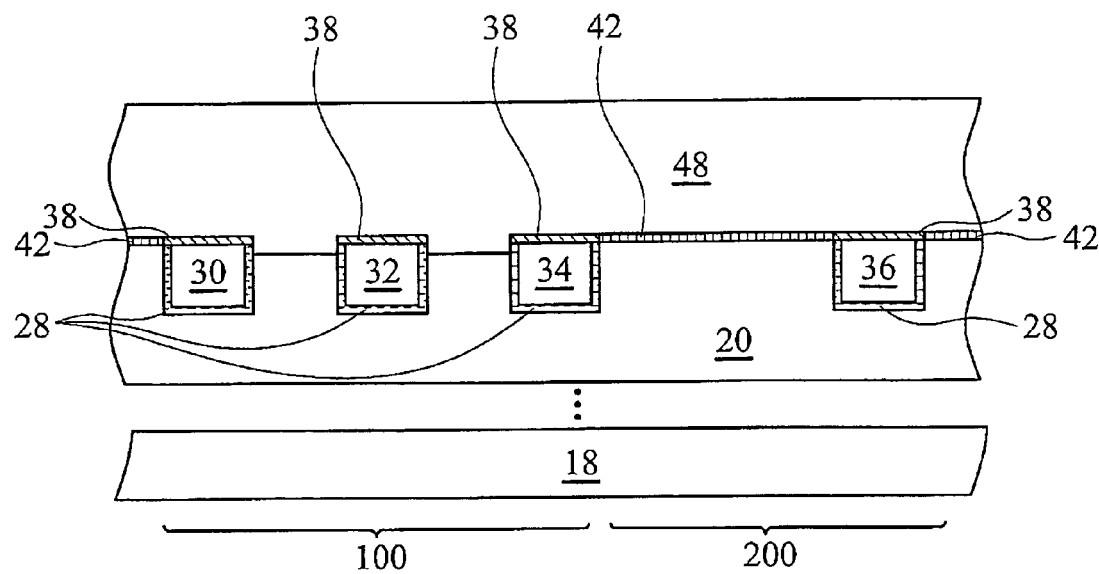

After the formation of conductive lines 30, 32, 34 and 36 and metal caps 38, dual damascene processes are preferably performed to form vias and upper-level conductive lines. In alternative embodiments, the vias and upper-level conductive lines can be formed by single damascene processes. Referring to FIG. 6, after removing the photo resist 44, a low-k dielectric layer 48, sometimes referred to an inter-metal dielectric (IMD) layer 48 is formed on the resulting structure, including region 100 where compressive layer 42 has been removed. The IMD layer 48 preferably has a k value less than about 3.4, and more preferably less than about 2.5. The IMD layer 48 and low-k dielectric layer 20 may have similar or substantially different k values. Preferred materials for forming the IMD layer 48 include carbon-doped silicon oxide, fluorine-doped silicon oxide, organic low-k materials and porous low-k materials. It is preferably formed by spin-on, chemical vapor deposition (CVD), or other known methods.

Figure 7:
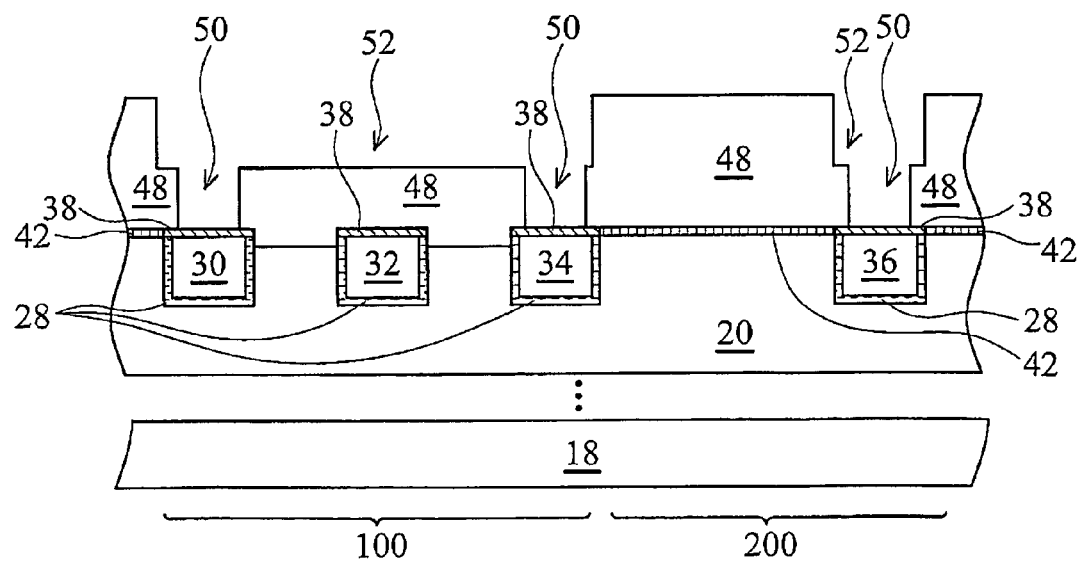

FIG. 7 illustrates the formation of via openings 50 and trench openings 52. Photo resists (not shown) are formed and patterned over the IMD layer 48. In the preferred embodiment, an anisotropic etch, preferably using fluorine containing etching gases, cuts through the IMD layer 48 and stops at the metal caps 38, thereby forming via openings 50. Trench openings 52 are then formed and used to form upper-level conductive lines. Since there is no etch stop layer, etching time is controlled so that the etching of the trench openings 52 stops at a desired depth. In alternative embodiments, a trench-first approach is taken, in which the trench openings 52 are formed prior to the formation of the via openings 50.

Figure 8A:
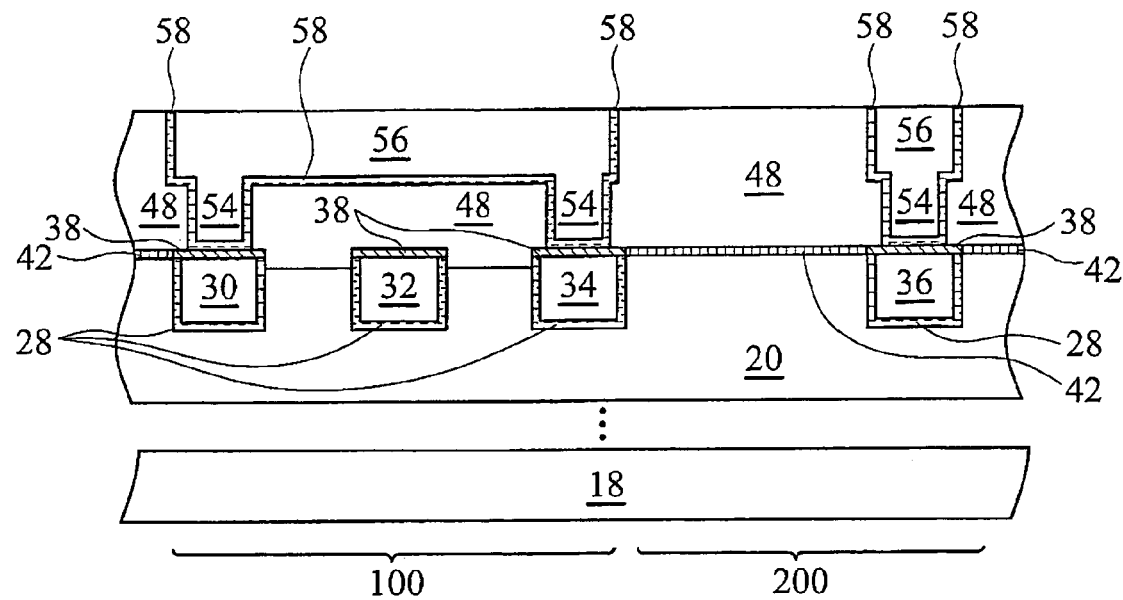
Figure 8B:
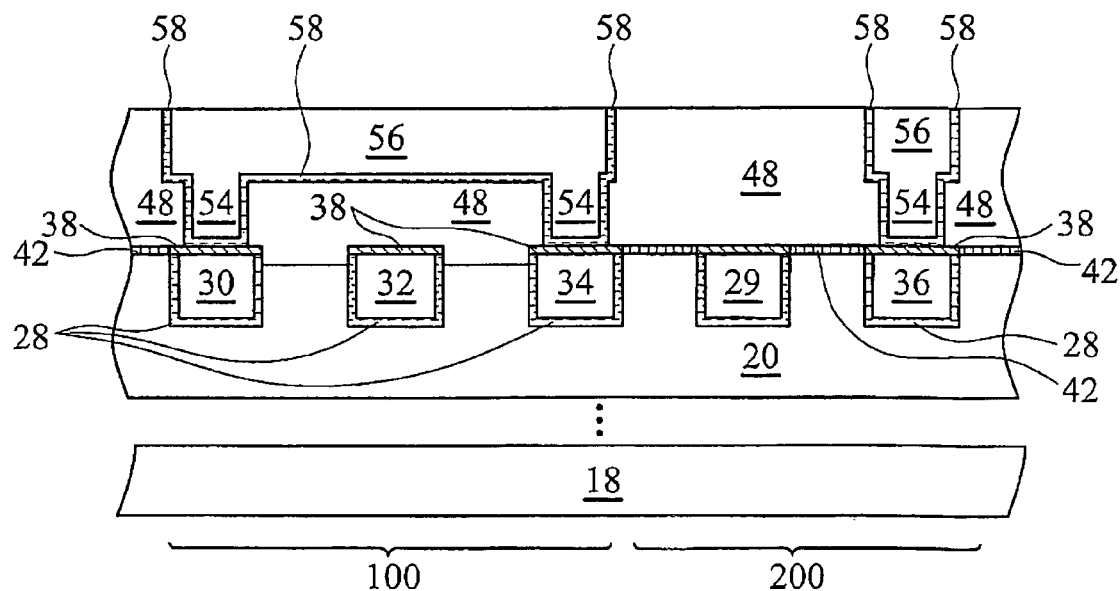

FIG. 8A illustrates the formation of a barrier layer 58, conductive lines 56 and vias 54. The barrier layer 58 prevents copper from diffusing into the IMD layer 48 and is preferably formed of a material comprising titanium, titanium nitride, tantalum, and tantalum nitride, and may have a composite structure. The thickness of the barrier layer is preferably between about 2 nm to about 40 nm. The via openings 50 and trench openings 52 are filled with conductive materials, preferably copper or copper alloys. However, other metals and metal alloys, such as aluminum, silver and gold can also be used. A CMP is performed to level the surface. FIG. 8B shows a similar structure having a dummy feature 29, wherein the removal of the portion of the compressive layer 42 on the dummy feature 29 is optional.

Figure 9A:
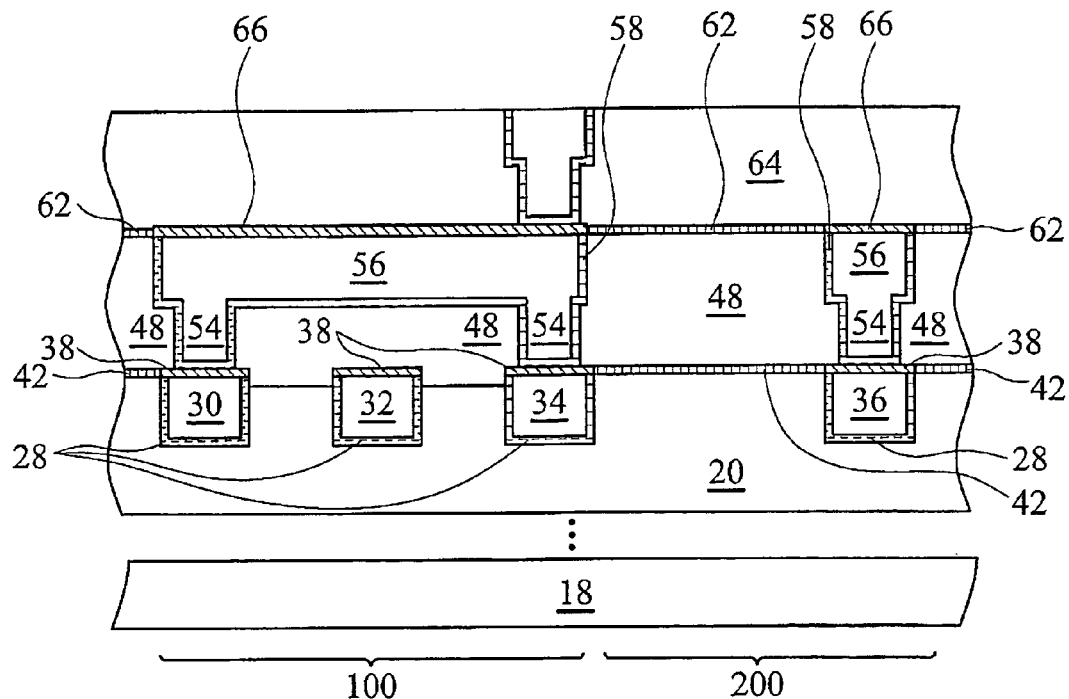
Figure 9B:
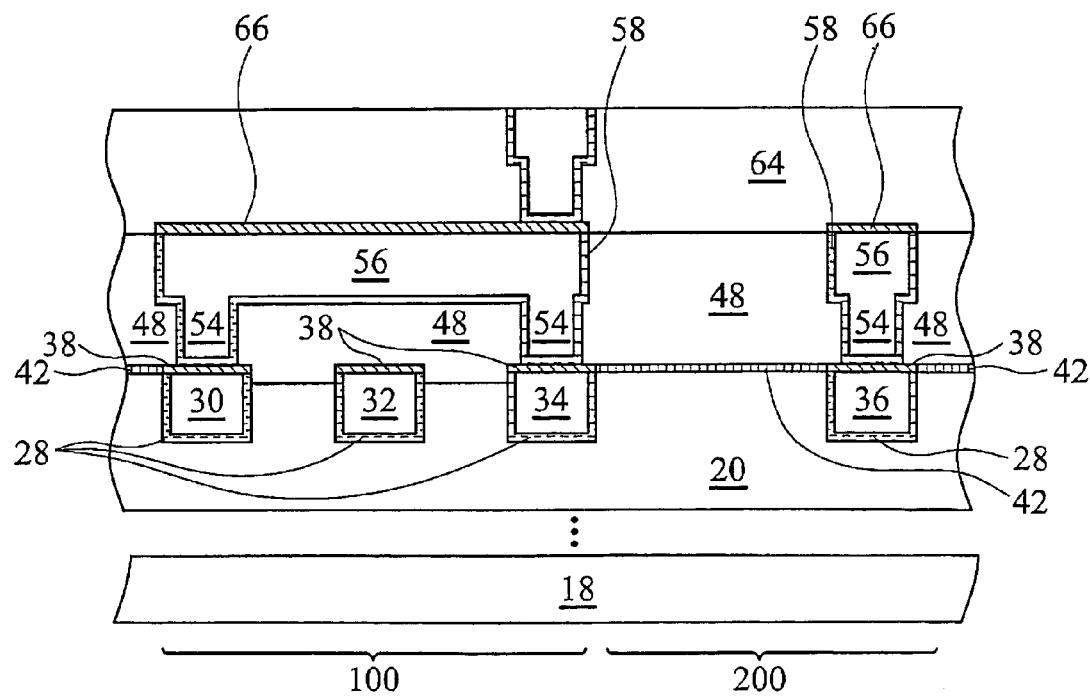

Referring to FIGS. 9A and 9B, more dielectric layers and metal lines can be formed over the previously formed structures. Typically, since the dimensions of the upper-level metal lines are greater than that of the lower-level metal lines, the dielectric constant in the upper-level dielectrics can be greater. As a result, in upper levels, the dielectrics, for example, the dielectric layer 64, are typically stronger than in lower levels. Accordingly, a compressive layer can be formed either on each upper-level IMD layer to provide stronger structural support, or can be formed on only some of the IMD layers. For example, the compressive layers can be formed on every other IMD layer. FIG. 9A illustrates a compressive layer 62 formed over the IMD layer 48, wherein caps 66 may be formed on metal lines formed in IMD layer 48. In FIG. 9B, there is no compressive layer formed over the dielectric layer 48.

The preferred embodiments of the present invention have several advantageous features. Compressive layers are provided to structurally support low-k dielectric layers, particularly extremely low-k dielectric layers, thus reducing the likelihood of cracking. The compressive layer is removed from regions having closely spaced conductive lines. Therefore, the adverse effects caused by the compressive layer are eliminated/reduced, thus the parasitic capacitance is also reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a substrate;
   a first low-k dielectric layer comprising a first region and a second region overlying the substrate;
   a plurality of conductive features in the first low-k dielectric layer;
   a cap layer on at least a portion of the conductive features; and
   a dielectric capping layer overlying the first low-k dielectric layer in the second region and substantially not in the first region, wherein the conductive features in the second region have a substantially greater spacing than the conductive features in the first region.

2. The semiconductor structure of claim 1 wherein the dielectric capping layer has a compressive stress.

3. The semiconductor structure of claim 2 wherein the compressive stress is greater than about 0.5 GPa.

4. The semiconductor structure of claim 1 wherein the first low-k dielectric layer has an inherent tensile stress.

5. The semiconductor structure of claim 1 wherein the conductive features in the first region have a spacing of less than about 200 percent of a width of the conductive features.

6. The semiconductor structure of claim 1 wherein the conductive features in the second region have a spacing of greater than about 300 percent of a width of the conductive features.

7. The semiconductor structure of claim 1 wherein the first low-k dielectric layer has a k value of less than about 2.5.

8. The semiconductor structure of claim 1 further comprising a dummy feature in the second region.

9. The semiconductor structure of claim 1, wherein the first low-k dielectric layer in the first region has a first top surface, the first low-k dielectric layer in the second region has a second top surface, and wherein the first top surface is lower than the second top surface, forming a recess in the first region in the first low-k dielectric layer.

10. The semiconductor structure of claim 9 wherein the recess has a depth of greater than about 10 Å.

11. The semiconductor structure of claim 10 wherein the depth of the recess is between about 10 Å and about 200 Å.

12. The semiconductor structure of claim 1 further comprising:
   a second low-k dielectric layer overlying the dielectric capping layer;

a first via in the second low-k dielectric layer, the via being connected to the cap layer; and an upper-level conductive feature in the second low-k dielectric layer, the upper-level conductive feature overlying the via.

13. The semiconductor structure of claim 12 wherein the first low-k dielectric layer and the second low-k dielectric layer have substantially different k values.

14. The semiconductor structure of claim 12 further comprising a third low-k dielectric layer over the second low-k dielectric layer, wherein the third low-k dielectric layer has a greater k value than the first low-k dielectric layer.

15. The semiconductor structure of claim 14 further comprising an additional dielectric capping layer over the second low-k dielectric layer in a third region, wherein a fourth region over the second low-k dielectric layer is substantially free of the additional dielectric capping layer.

16. The semiconductor structure of claim 15, wherein the third region has a substantially greater dimension than the first region, and the fourth region has a greater dimension than the second region.

17. The semiconductor structure of claim 14, wherein there is no dielectric capping layer between the second and the third low-k dielectric layers.

18. The semiconductor structure of claim 1 wherein the conductive features in the first region having the spacing are physically separated from each other.

19. The semiconductor structure of claim 1 wherein the cap layer is directly over and physically contacts the portion of the low-k dielectric layer between the conductive features.

20. A semiconductor structure comprising:

a substrate;

a low-k dielectric layer overlying the substrate;

conductive features in the low-k dielectric layer defining regions therebetween, wherein the regions comprise first regions and second regions, and wherein spacings between the conductive features in the first regions are substantially smaller than spacings between the conductive features in the second regions; and a dielectric capping layer overlying the low-k dielectric layer in the second regions, wherein the first regions are substantially free of the dielectric capping layer.

21. The semiconductor structure of claim 20 wherein the spacings between the conductive features in the first regions are less than about 200 percent of a width of the conductive features.

22. The semiconductor structure of claim 20 wherein the spacings between the conductive features in the second regions are greater than about 300 percent of a width of the conductive features.

23. The semiconductor structure of claim 20 wherein the conductive features in the first region having the spacings are physically separated from each other.

* * * * *